United States Patent [19]

Sugiyama et al.

[11] 4,224,671
[45] Sep. 23, 1980

[54] ARITHMETIC OPERATION APPARATUS FOR AN ELECTRONIC WATT-HOUR METER

[75] Inventors: Fumio Sugiyama, Sagamihara; Isao Tashiro, Kawasaki, both of Japan

[73] Assignee: Tokyo Shibaura Denki Kabushiki Kaisha, Kawasaki, Japan

[21] Appl. No.: 929,504

[22] Filed: Jul. 31, 1978

[30] Foreign Application Priority Data

Jul. 30, 1977 [JP] Japan .................................. 52-91612
Mar. 22, 1978 [JP] Japan .................................. 53-32750

[51] Int. Cl.$^2$ ......................... G01R 11/32; G06G 7/16
[52] U.S. Cl. .................................. 364/483; 324/142; 340/347 NT; 364/841
[58] Field of Search ............... 364/483, 842, 841, 843, 364/844; 324/141, 142; 328/160, 127; 340/347 NT

[56] References Cited

U.S. PATENT DOCUMENTS

| | | | |
|---|---|---|---|
| 3,466,460 | 9/1969 | Connolly | 364/844 X |
| 3,610,910 | 10/1971 | Udall | 364/842 |
| 3,746,851 | 7/1973 | Gilbert | 364/842 |
| 3,749,894 | 7/1973 | Avdeef | 340/347 NT |
| 3,757,099 | 9/1973 | Anderson | 364/844 |
| 3,780,273 | 12/1973 | Turrell | 364/483 X |
| 3,955,138 | 5/1976 | Milkovic | 324/142 X |
| 4,056,775 | 11/1977 | Milkovic | 324/142 |
| 4,066,960 | 1/1978 | Milkovic | 364/483 X |

FOREIGN PATENT DOCUMENTS

49-21817 6/1974 Japan.
49-21818 6/1974 Japan.

OTHER PUBLICATIONS

Stockton: New Form of Digital Wattmeter using Double Dual-Slope Principle, Electronics Letters, Jul. 7, 1977, (in 369-483), vol. 13, No. 14, pp. 406, 407.

Primary Examiner—Felix D. Gruber
Attorney, Agent, or Firm—Oblon, Fisher, Spivak, McClelland & Maier

[57] ABSTRACT

Disclosed is an arithmetic operation apparatus for an electrical watt-hour meter for cumulatively adding products arrived at by multiplying two input signals in succession which correspond respectively to a line voltage and line current. The apparatus comprises a pulse width modulator for modulating a first input signal of line voltage into the form of a pulse width for each sampling period. A certain number of the sampling periods is taken as a first arithmetic operation period (hereinafter referred to as "a first unit operation period"). During the first unit operation period, a second input signal of line current is supplied for a length of time corresponding to each modulated pulse width of the first input signal. The second input signals thus supplied are integrated by a first integrator during each first unit operation period. During a succeeding operation period consisting of the same specified number of sampling periods (hereinafter referred to as "a second unit operation period"), a reference signal which has a polarity opposite to that of the integrated signal at the end of the first unit operation is reversely integrated by the first integrator. During the second unit operation period in which the above-mentioned reverse integration is carried out, the second input signal which is to be integrated for a length of time corresponding to the modulated pulse width of the first input signal is conducted to a second integrator to be integrated during the respective sampling periods. Each of the first and second integrators alternately carries out the integration and the reverse integration during the alternately recurring first and second unit operation periods following the aforesaid ones.

A counter counts a number of clock pulses issued for a length of time varying with the reverse integration applied each time. The number of clock pulses thus counted are added in succession, thereby determining a cumulatively added sum of the multiplication products of the first and second input signals which corresponds to a watt-hour value.

5 Claims, 9 Drawing Figures

SWITCHING INSTRUCTION

ARITHMETIC OPERATION APPARATUS FOR AN ELECTRONIC WATT-HOUR METER

This invention relates to an arithmetic operation apparatus for an electric watt-hour meter for cumulatively adding the products arrived at by multiplying every two input signals in succession corresponding to a line voltage and line current respectively to obtain a watt-hour value. Such apparatus known to date carries out an analog - digital conversion (hereinafter referred to as "A-D conversion") of two signals, multiplies the values represented by the resultant digital signals, for example, by a microcomputer, and a counter for summing the product of said multiplication in the form of a digital signal. However, the conventional apparatus of the above-mentioned type has the drawback that the respective sections have a complicated arrangement, rendering the apparatus bulky as a whole and resulting in a high production cost. Further, the prior art arithmetic operation apparatus using a double integrator modulates a first input signal having a multiplicant value into the form of a pulse width; and integrates a second input signal having a multiplier value relative to said first input signal for a length of time corresponding to the modulated pulse width, thereby determining a product or watt-hour value arrived at by multiplying the first input signal used as a multiplicand by the second input signal used as a multiplier, subjects an integrated value corresponding to the product of said multiplication to reverse integration by applying a reference signal until the integrated value is reduced to zero and determines said integrated value by counting a length of time required for said reverse integration. In this case, integration and reverse integration are repeated for each sampling period. An error often occurs in counting the time of reverse integration corresponding to the frequency of a reference clock pulse defining a sampling period. Where it is desired to determine cumulatively an added sum of the multiplication products of every two input signals supplied in succession during a plurality of the sampling periods, errors appearing in the respective sampling periods are finally accumulated to a prominently large value, thereby failing to carry out measurement with high precision.

A further disadvantage of the customary arithmetic operation apparatus is that where integration and reverse integration are alternately undertaken to determine a cumulatively added sum of the multiplication products of every two input signals supplied in succession, then the originally desired process of multiplying two input signals is temporarily suspended while the reverse integration is carried on.

It is accordingly the object of this invention to provide an arithmetic operation apparatus for an electronic watt-hour meter which is simple in construction, free from the drawbacks accompanying the prior art and capable of determining with high precision a cumulatively added sum of the multiplication products of two input signals supplied in succession.

To this end, the present invention provides an arithmetic operation apparatus for an electronic watt-hour meter which comprises a means for modulating a first input signal having a multiplicant value into the form of a pulse width for each prescribed sampling period throughout the whole arithmetic operation time in which a first unit operation period consisting of a plurality of sampling periods and a second unit operation period similarly consisting of a plurality of sampling periods alternately recur; a first integration means which, during the first unit operation period, receives the second input signal used as a multiplier for lengths of time corresponding to the respective pulse widths modulated from the first input signal and progressively integrates the second input signal; a first reverse integration means for carrying out during a unit operation period succeeding the first unit operation period the reverse integration of an integrated value obtained from the first integration means with a reference signal; a second integration means for progressively integrating the second input signal for lengths of time corresponding to the modulated pulse widths of the first input signal; a second reverse integration means for carrying out the reverse integration of an integrated value obtained during the first unit operation period with a reference signal; a counting means for determining a length of time required for reverse integration to be continued by the first and second reverse integration means until an integrated value is reduced to zero by counting a number of reference clock pulses issued for a length of time corresponding to the period of said reverse integration; and a display means for indicating a cumulatively added sum of the multiplication products which corresponds to a watt-hour value of the first and second input signals from the counts made by said counting means.

With this invention, a plurality of unit operation periods each consisting of a plurality of sampling periods are made alternately to recur at a prescribed interval with the polarity reversed each time. During a given unit operation period, the second input signal is integrated relative to the first input signal during the respective sampling periods by an integrator. An integrated value thus obtained is reversely integrated during the succeeding polarity-reversed unit operation period with a reference signal. This is unlike, therefore, the prior art arithmetic operation apparatus, in which integration and reverse integration are alternately repeated fo each sampling period, thus requiring counting clock pulses to have a much higher frequency than that of the sampling clock pulses to prevent errors. According to this invention, however, multiplication products of first and second input signals obtained during the respective sampling periods are cumulatively added throughout a unit operation period. The resultant integrated value is reversely integrated during the succeeding unit operation period. Therefore, clock pulses for counting a value corresponding to a length of time of said reverse integration may have a low frequency, thereby offering an advantage in providing an IC version of the arithmetic operation apparatus.

Further during a second operation period, a second input signal is supplied to a second integrator, while a first input signal is reversely integrated. Thus, the multiplication products of the pulse width-modulated first input signal and the second input signal are cumulatively added, thereby continuously providing an integrated value throughout a prescribed number of unit operation periods without omitting the supply of an input signal during any of said unit operation periods. Accordingly, the arithmetic operation apparatus for an electronic watt-hour meter of this invention is widely applicable to various types of multiplication devices.

This invention can be more fully understood from the following detailed description when taken in conjunction with the accompanying drawings, in which:

FIGS. 3 (a) to 3 (i) collectively constitute a time chart of the operation of the arithmetic operation apparatus of FIG. 1, showing the waveforms of various signals used;

FIGS. 6 (a) to 6 (r) jointly constitute a time chart of the operation of the arithmetic operation apparatus of FIG. 4, showing the waveforms of various signals used;

FIGS. 7 (a) to 7 (d) and 8 (a) to 8 (h) respectively set forth a time chart illustrating the effect of the second embodiment of the invention.

DETAILED DESCRIPTION OF THE PREFERRED EMBODIMENTS

There will now be described by reference to the accompanying drawing an arithmetic operation apparatus for an electronic watt-hour meter according to one embodiment of this invention.

Figure 1:
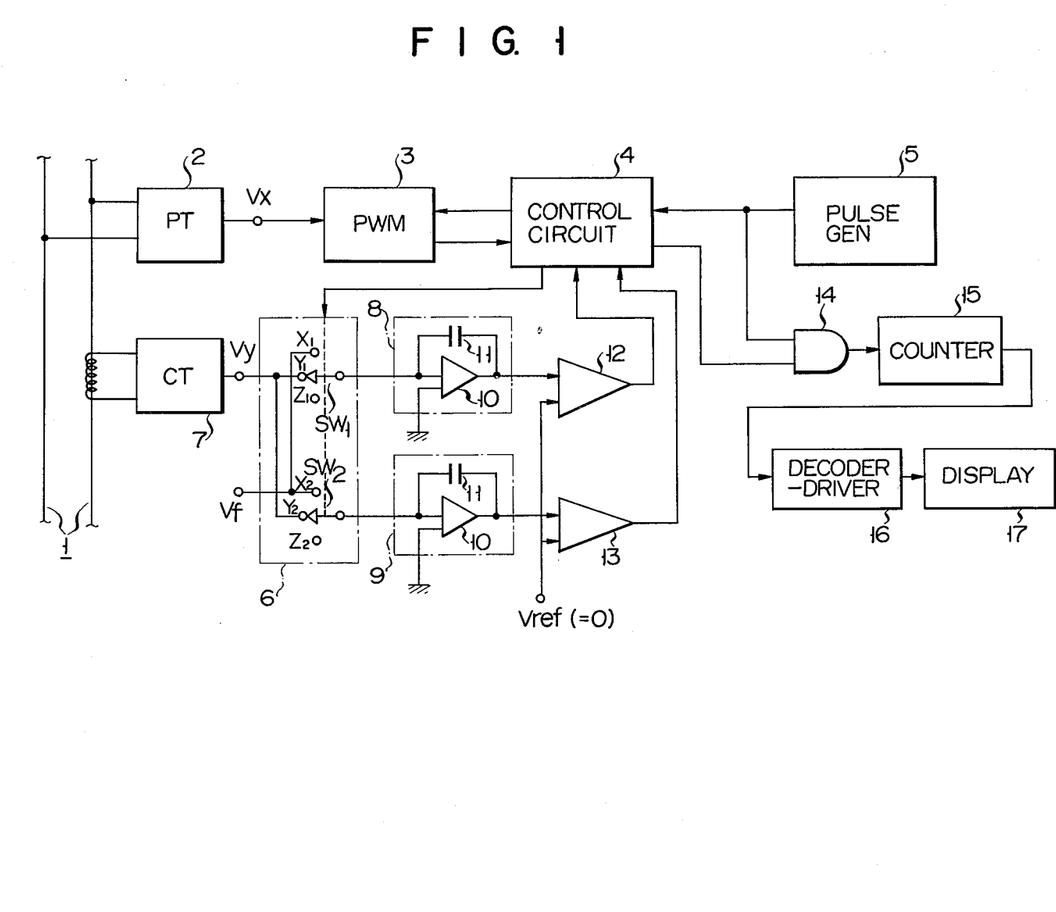
FIG. 1 is a block circuit diagram of an arithmetic operation apparatus for an electronic watt-hour meter according to one embodiment of this invention.

FIG. 1 is a block circuit diagram of an arithmetic operation apparatus for an electronic watt-hour meter. A first input signal having a voltage level $V_x$ is supplied to a pulse width modulator 3 (hereinafter abbreviated as "PWM") through a voltage detector (PT) 2 connected to a power supply line 1. The PWM 3 modulates the first input signal $V_x$ of line voltage into the form of a pulse width upon receipt of a control signal from a control circuit 4 during each of a prescribed number of sampling periods for each unit operation period. A pulse width-modulated output signal from the PMW 3 which is proportional to the first input signal $|V_x|$, is conducted to the control circuit 4. At this time the control circuit 4 issues an instruction to a switch assembly 6 for a specified contact thereof to be used. The supply of an input signal to, and the generation of an output signal from the control circuit 4 are controlled by an output clock pulse from a clock pulse generator 5 having a reference frequency. The switch assembly 6 has two input terminals, one of which is supplied with a second input signal y having a negative current level in the case of an embodiment shown in FIG. 1 through a current detector 7 connected to the power supply line 1, and the other of which receives a reference signal f on the basis of which the later described reverse is carried out. The switch assembly 6 comprises first and second switches $SW_1$, $SW_2$ which are alternately closed with respect to the second current signal having a negative current level $V_y$ and the reference signal $V_f$ respectively. In this case the reference signal has a positive polarity with respect to the second negative current signal $V_y$. The first switch $SW_1$ is connected to a first integrator 8, and the second switch $SW_2$ is connected to a second integrator 9. The first and second integrators 8, 9 are each formed of an operational amplifier 10 and a capacitor 11 connected to a feedback loop of said amplifier 10 to be used as an integration element. Output signals showing a value of integration which are delivered from the first and second integrators 8, 9 are conducted to the corresponding comparators 12, 13 to be compared with a signal having a reference voltage level, $V_{ref}$, for example, a ground potential. Output signals denoting the result of said comparison which are issued from the comparators 12, 13 are supplied to the control circuit 4, an output control signal from which controls the operation of the gate of an AND circuit 14. This AND circuit 14 allows the passage of clock pulses having a reference frequency which are sent forth from the clock pulse generator 5 for a length of time corresponding to a period of reverse integration. A counter 15 counts clock pulses conducted through the gate of the AND circuit 14. The counter alternately counts a time of reverse integration carried out by the first and second integrators 8, 9 respectively, thereby making it possible cumulatively to add the multiplication products of the first and second input signals $V_x$, $V_y$ continuously throughout a series of a predetermined number of unit operation periods. A cumulatively added sum of said multiplication products is indicated on a display device 17 through a decoder—driver 16.

Each of the first and second integrators 8, 9 alternately carry out integration and reverse integration throughout a series of first and second unit operation periods each consisting of a prescribed number of sampling periods.

Figure 2:
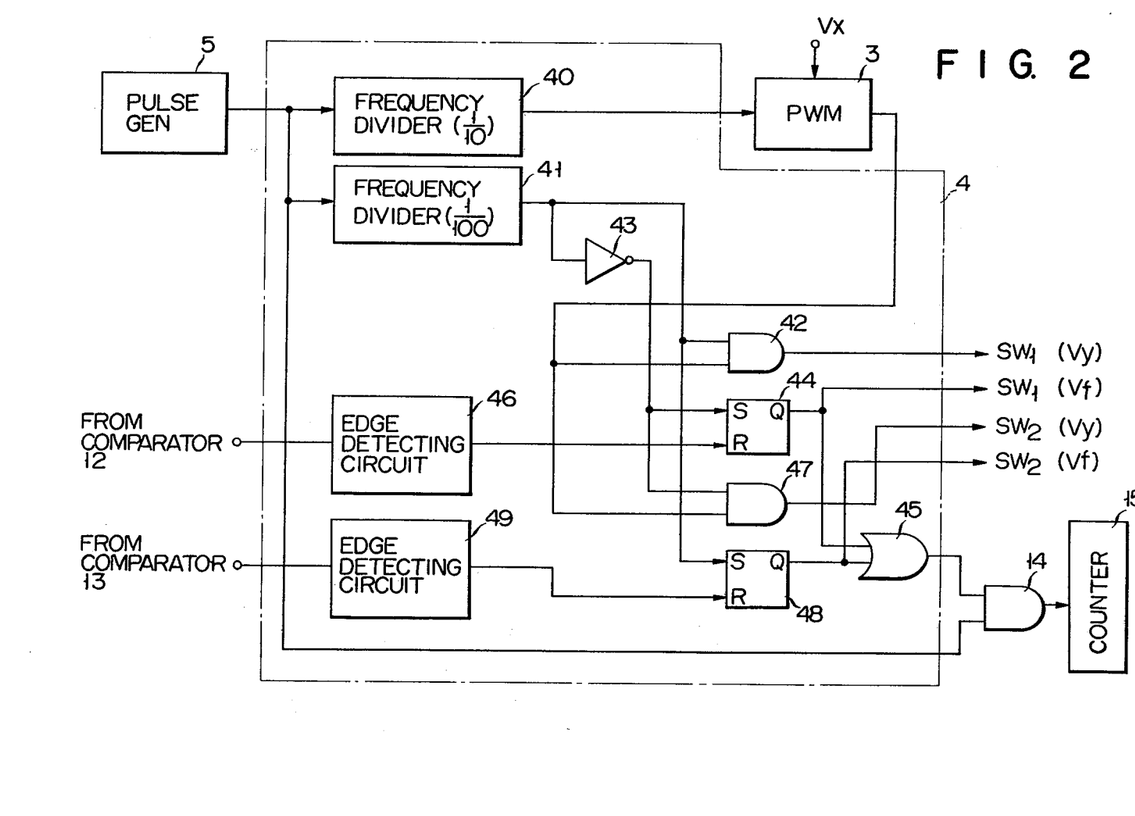
FIG. 2 shows the concrete arrangement of a control circuit used with one embodiment of the invention shown in FIG. 1.
Figure 3:
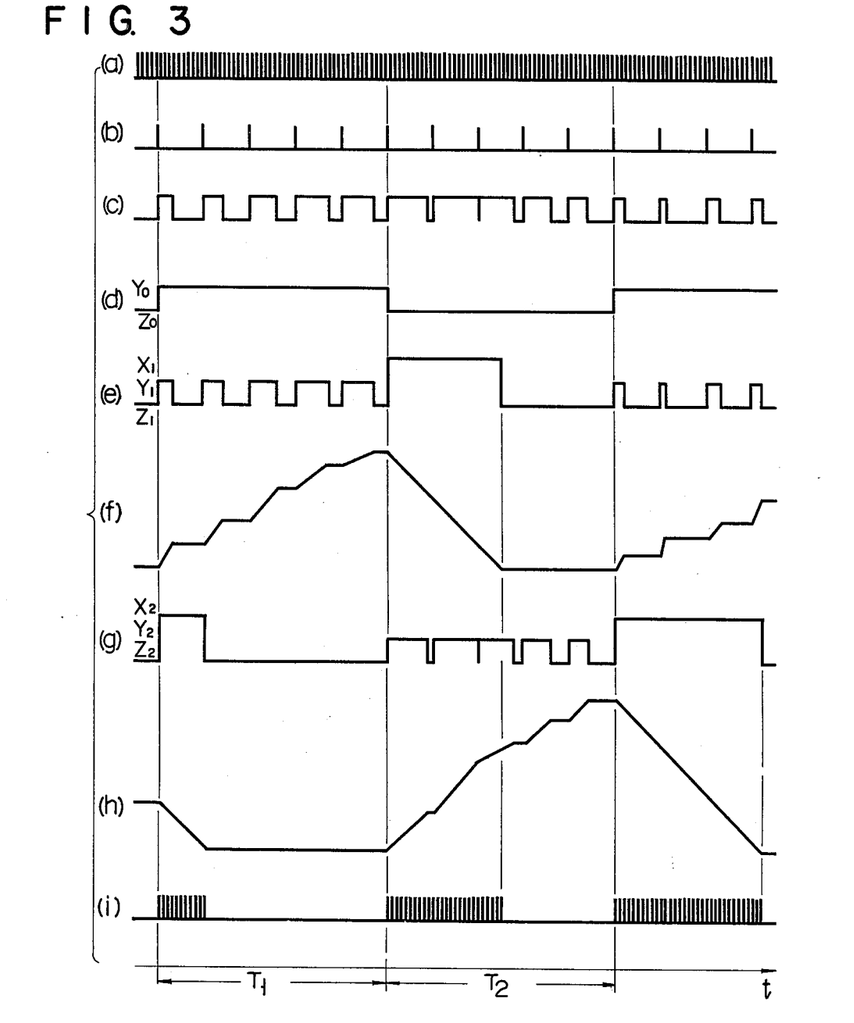

The changeover operation of the contacts of the first and second switches $SW_1$, $SW_2$ of the switch assembly 6 is controlled by the output of the control circuit 4 arranged as shown in FIG. 2. FIG. 3 (a) to FIG. 3 (i) collectively indicate a time chart of the operation of the control circuit 4, showing the waveforms of various signals used. This control circuit 4 comprises a frequency divider 40 which divides the frequency of clock pulses of a reference frequency issued from the clock pulse generator 5 as illustrated in FIG. 3 (a), and sends forth a signal which defines for the PWM 3 a frequency of sampling period FIG. 3 (b). This PWM 3 samples the voltage level of the first input signal upon receipt of the sampling period - defining signal, and generates a signal (FIG. 3 (c)) having a modulated pulse width corresponding to a voltage level thus sampled. A frequency divider 41 is connected to the clock pulse generator 5 and supplies one of the gates of an AND circuit 42 (FIG. 2) with a polarity—reversed output signal (FIG. 3 (d)) for defining the respective unit periods in which integration is carried out by the first and second integrators 8, 9. The level $Y_o$ of the signal of FIG. 3 (d) denotes the first unit operation period and the level $Z_o$ thereof represents the second unit operation period. The other gate of the AND circuit 42 is supplied with a signal from $PWM_3$ which is pulse width modulated by a first input signal $V_x$. In FIGS. 3(e) and 3(g) the waveforms indicate the switching states of the switches SW1 and SW2 respectively for convenience. The state "Z" shows that SW1 or SW2 is connected to the terminal $Z_1$ or $Z_2$ and that no signal is supplied to the integrators 8 and 9 in FIG. 1. The state "Y" shows that SW1 or SW2 is connected to the terminal $Y_1$ or $Y_2$ and that the second input signal $V_y$ is supplied to the integrator 8 or 9 in FIG. 1. The state "X" shows that SW1 or SW2 is connected to the terminal $X_1$ or $X_2$ and that the reference signal $V_f$ is supplied to the integrator 8 or 9 in FIG. 1. The frequency divider 41 is connected to the set terminal of a flip-flop circuit 44 through an inverter 43. When the output level changes as shown in FIG. 3 (d) at the end of the first unit operation period $T_1$, then the inverter 43 generates an output signal, which sets the flip-flop circuit 44. A set output from the flip-flop circuit 44 causes the operation of the first switch $SW_1$ to be changed over to receive a reference signal $V_f$ as shown in FIG. 3 (e) (the state "X"). The reference signal $V_f$ is chosen to have a polarity opposite to that of the integrated signal of the integrator 8 at the end of the period $T_1$. At this time, a set output from the flip-flop circuit 44 is also supplied to one of the gates of the AND circuit 14 through an OR circuit 45. The other gate of the AND circuit 14 is supplied with clock pulses issued from the clock pulse generator 5. The first integrator 8 commences reverse integration as shown in FIG. 3 (f) with the reference signal $V_f$. The reverse integration is continued, until the voltage of an output signal from the first integrator 8 reaches a reference voltage level, namely, a ground potential. That point of time is detected by the comparator 12. Upon receipt of an output signal from the comparator 12 showing the result of comparison, an edge detection circuit 46 (formed of, for example, a differentiation circuit) included in the control circuit 12 proves that the aforesaid output signal from the first integrator 8 has reached a reference voltage level, namely, a ground potential. At this time, the flip-flop circuit 44 is reset, the first switch $SW_1$ is opened to regain its original position as shown in FIG. 3(e) (the state "Z") and the counter 15 ceases counting. Accordingly, the counter 15 counts a number of clock pulses corresponding to a length of time required for reverse integration as shown is FIG. 3 (i). A number of clock pulses thus counted is indicated on the display device 17 through the decoder-driver 16. When the inverter 43 sends forth an output signal at the end of the first unit operation period, then the first integrator 8 commences reverse integration. At this time, an output signal defining a unit operation period issued from the frequency devider 41 is also supplied to one of the gates of the AND circuit 47. Since the other gate thereof is supplied with a pulse width—modulated signal delivered from the PWM 3, as shown in FIG. 3(c) during the second unit operation period $T_2$, the second switch is to be connected to an input contact $Y_2$ for receiving the second input signal $V_y$ as shown in FIG. 3(g) (the state "Y"). Then, during the period $T_2$, the second integrator 9 integrates the second input signal $V_y$ for a length of time corresponding to the modulated pulse width of an output signal from the PWM 3. The second integrator 9 produces an output signal as shown in FIG. 3(h). When, at the end of the second unit operation period, the set terminal of the flip-flop circuit 48 is supplied with an output signal from the frequency divider 41 which defines the succeeding polarity-reversed unit operation period, then a set output from the flip-flop circuit 48 causes the stationary contact of the second switch SW 2 to be connected to an input contact $X_2$ thereof for receiving a reference signal $V_f$ for reverse integration. The reference signal $V_f$ is chosen to have a polarity opposite to that of the integrated signal of the integrator 9 at the end of the period $T_2$. Accordingly, the second integrator 9 commences reverse integration. The result of said reverse integration is detected by causing a set output signal from the flip-flop circuit 48 to be supplied to one of the gates of the AND circuit 14 through the OR circuit 45, and counting by the counter 15 through the other gate of the AND circuit 14 a number of clock pulses which are supplied from the clock pulse generator 5. The reverse integration is continued until the flip-flop circiuit 48 is reset, namely, until the second comparator 13 detects that the voltage of an output signal from the second integrator 9 reaches a reference voltage level or a ground potential, and an output detection signal from the second comparator 13 is detected by an edge detector 49 included in the control circuit 14.

As mentioned above, an integrated value of the product of the first and second input signals obtained during the first unit operation period is reversely integrated during the succeeding second unit operation period. Similarly, an integrated value of the product of the first and second input signals obtained during the second unit operation period is reversely integrated during the first unit operation period (note: the first and second unit operations alternately recur throughout a prescribed series). Thus, an integrated value of the first and second input signals is reversely integrated successively from one unit operation to another. A length of time required for the reverse integration is counted by the counter 15. Therefore a cumulatively added sum of the integrated values of the first and second signals obtained throughout a prescribed series of the alternately recurring first and second unit operation periods can be determined from a number of clock pulses counted by the counter 15.

Namely, where the PWM3 produces a time width signal corresponding to the first input signal $V_x$, and the second input signal $V_y$ is integrated for a length of time corresponding to said time width signal, then said integration value denotes a multiplication product of the first and second input signals. With $T_x$ taken to denote the time width, the integration value $V_I$ is expressed by the following equation:

$$V_I = \int_0^{T_x} V_Y dt = V_y \cdot T_x \propto V_y \cdot V_x$$

Thus, the integration value $V_I$ becomes proportional to the multiplication product $V_x \cdot V_y$. Consequently, a number of clock pulses (FIG. 3(i)) issued during the first or second unit operation period is proportional to a cumulatively added sum of the multiplication products of the first and second input signals obtained at the respective sampling points during the second or first unit operation period immediately preceding the above-mentioned second or first unit operation period.

With the arithmetic operation apparatus for an electronic watt-hour meter of this invention, errors in counting clock pulses issued during reverse integration which has been carried out for each sampling period in the prior art are substantially prevented from appearing during the unit operation period in which reverse integration is carried out.

Namely, where, as in the prior art arithmetic operation apparatus, the multiplication product of the first and second input signals is determined by carrying out the reverse integration of said multiplication product for each sampling period, then said multiplication product is counted by a 0.1μ sec. clock pulse, if a length of time required for the reverse integration of said multiplication product or a pulse width is taken to be 0.1 millisecond and measurement precision is set at 0.1%. In this case it is necessary to issue clock pulses having a frequency of 10 MHz. In contrast, where, as in the present arithmetic operation apparatus for an electronic watt-hour meter, the multiplication products of the first and second input signals are cumulatively added, then a length of time required for the reverse integration of a cumulatively added sum of the multiplication products or a pulse width is 0.5 millisecond, if a unit operation period consists of 5 sampling periods. Further with measurement precision set at 0.1%, it is sufficient to carry out measurement by clock pulses of $0.5\mu$ sec., or clock pulses having a frequency of 2 MHz. If a unit operation period consists of 100 sampling periods, it is sufficient to use clock pulses having a frequency of 100 KHz. This fact offers great advantage in providing the IC version of an arithmetic operation apparatus. If measurement is made by clock pulses having a frequency of 10 MHz instead of 100 KHz, then measurement precision is prominently elevated to 0.001%.

According to this invention, each of the first and second integrators 8, 9 alternately carries out the integration of the products arrived at by multiplying the pulse width-modulated first input signal by the second input signal and the reverse integration of a cumulatively added sum of the integrated values from one unit operation period to another during a given unit operation period in which the first integrator 8 is integrating the second input signal, the second integrator 9 carries out the reverse integration of a cumulatively added sum of the integrated values of the second input signal obtained during the preceding unit operation period. Conversely, during a given unit operation period in which the first integrator 8 undertakes said reverse integration, the second integrator performs the cumulative addition of the integrated values of the second input signal for a length of time corresponding to the respective modulated pulse width of the first input signal. Therefore, this invention enables the first and second input signals to be successively integrated, namely, the multiplication products of said signals to be cumulatively added throughout a prescribed series of alternately recurring unit operation periods, thereby eliminating the disadvantages of the prior art arithmetic operation apparatus that multiplication of the first and second input signals was temporarily suspended with a resultant loss of accuracy.

In the foregoing description the first input signal $V_x$ was chosen to have a positive or a negative value and the second input signal $V_y$ was chosen to have a negative value. The reference signal $V_f$ was chosen to have a positive value. In general, the first and second input signals $V_x$ and $V_y$ can have both positive and negative values. In this situation, the pulse width-modulated signal is proportional to an absolute value of the first input signal, $|V_x|$. A reference signal $\pm V_f$ is provided. If the first input signal $V_x$ has a positive value and the second input signal $V_y$ supplied to the integrator 8 or 9 has a positive value, $V_x \cdot V_y$ has a positive value. Therefore an integrated signal of the integrator 8 or 9 at the end of the unit operation period has a negative value. For this case, the reference signal $V_f$ is chosen to have a negative value. If the first input signal $V_x$ has a negative value and the second input signal $V_y$ having a polarity inverted, negative value is supplied to the integrator 8 or 9, $V_x \cdot V_y$ has a positive value. Therefore, an integrated signal of the integrator 8 or 9 at the end of the unit operation period has a negative value. For this case, the reference signal $V_f$ is chosen to have a positive value. In the above-mentioned case the counter effects a count-up operation and a watt-hour value is obtained. If the first input signal $V_x$ has a positive value and the second input signal $V_y$ which is supplied to the integrator 8 or 9 has a negative value, $V_x \cdot V_y$ has a negative value. Therefore, an integrated signal of the integrator 8 or 9 at the end of the unit operation period has a positive value and at this time the reference signal $V_f$ is chosen to have a positive value. If the first input signal $V_x$ has a negative value and the second input signal $V_y$ which is supplied to the integrator 8 or 9 has a positive value, $V_x \cdot V_y$ has a negative value. Therefore, an integrated signal of the integrator 8 or 9 at the end of the unit operation period has a negative value and at this time the reference signal $V_f$ is chosen to have a negative value. In the above-mentioned case the counter effects a count-down operation and the watt-hour value is obtained. In the above-mentioned case, it is necessary to judge the polarity of the first input signal and output signal from the integrator 8 or 9 at the end of the period $T_1$ or $T_2$.

According to the foregoing embodiment, a second input signal is integrated for a length of time corresponding to the modulated pulse width of a first input signal. Values of integration are cumulatively added during a unit operation period. These cumulative added integrated values are reversely integrated during the succeeding unit operation period with a reference signal. Where an input signal has an extremely low voltage level, a comparator for judging the polarity of an output signal from the integrator is liable to exhibit an erroneous behavior. A reference signal used in reverse integration has the opposite polarity to an input signal which is to be integrated. Where an input signal has a very low integration level, the comparator sometimes misjudges the polarity of an output signal from the integrator due to its limited capacity. Where the comparator misjudges an integrated value of an input signal to have a negative polarity, instead of a positive polarity, then it happens that during the succeeding polarity-reversed unit operation period reverse integration is carried out with a reference signal of positive polarity, though a reference signal of negative polarity should be used, and in consequence, integration, instead of reverse integration, continues throughout two consecutive unit operation periods, thereby failing to perform reverse integration.

Figure 4:
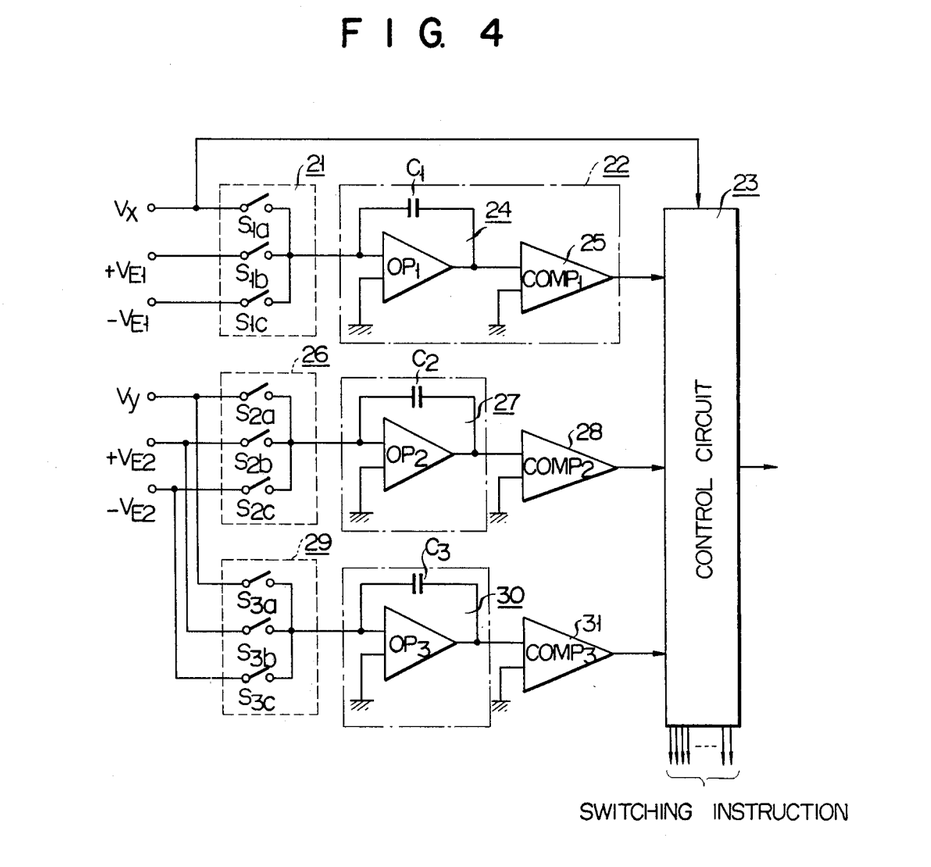
FIG. 4 is a block circuit diagram of an arithmetic operation apparatus according to another embodiment of this invention.

There will now be described by reference to FIG. 4 an arithmetic operation apparatus for an electronic watt-hour meter according to another embodiment of this invention which attains the fundamental object and effect of the invention and always carries out correct reverse integration, even where the polarity of an input signal is misjudged as described above, thereby providing an accurate value of integration. Referring to FIG. 4, a first input voltage signal having a voltage level $V_x$ is supplied to a pulse width modulator PWM22 through a first switch assembly 21 to have the pulse width modulated. The PWM signal is conducted to a control circuit 23. The switch assembly 21 comprises a first switch $S_{1a}$ for receiving the first input signal $V_x$, a second switch $S_{1b}$ for receiving a first reference signal $+V_{E1}$ having the same polarity as an integrated value of the first input signal in order to carry out the additional integration of said reference signal $+V_{E1}$ for a prescribed length of time immediately after the integration of the first input signal and a third switch $S_{1c}$ for receiving a second reference signal $-V_{E1}$ having the opposite polarity to the first reference signal $+V_{E1}$ in order to carry out the reverse integration of a value of the above-mentioned additional integration. The PWM22 comprises an integrator 24 consisting of an operational amplifier $OP_1$ and a capacitor $C_1$ connected to the feedback loop of said amplifier $OP_1$ and a comparator 25 for judging the polarity of an output signal from the integrator 24. The pulse width-modulated first input signal having a voltage level $V_x$ is delivered to the control circuit 23. The second input current signal having a current level $V_y$ is sent forth to a first integrator 27 through the second switch assembly 26. This second switch assembly 26 comprises a first switch $S_{2a}$ for receiving the second input signal $V_y$, a second switch $S_{2b}$ for receiving a third reference signal $+V_{E2}$ having the same polarity as an integrated value of the second input signal $V_y$ in order to carry out the additional integration of said third reference signal $+V_{E2}$ for a prescribed length of time immediately after the integration of the first input signal and a third switch $S_{2c}$ for receiving a fourth reference signal $-V_{E2}$ having the opposite polarity to the third reference signal $+V_{E2}$ in order to carry out the reverse integration of the integrated value of the first input signal and the additionally integrated value of the third reference signal $+V_{E2}$. The first integrator 27 comprises an operational amplifier $OP_2$ and a capacitor $C_2$ connected to the feedback loop thereof. An output denoting a value of reverse integration which is sent forth from the first integrator 27 is supplied to the control circuit 23 through a comparator 28.

During the polarity-reversed unit operation period following a given preceding unit operation period, the second input signal $V_y$ is conducted to a second integrator 30 through a third switch assembly 29 after changing over the operation of the second switch assembly 26 in order to be integrated for a length of time corresponding to the modulated pulse width of the first input signal $V_x$. The third switch assembly 29 comprises a first switch $S_{3a}$ for receiving the second input signal $V_y$, second switch $S_{3b}$ for receiving the third reference signal $+V_{E2}$ and a third switch $S_{3c}$ for receiving the fourth reference signal $-V_{E2}$. The second integrator 30 comprises an operational amplifier $OP_3$ and a capacitor $C_3$ connected to the feedback loop thereof. An output signal denoting a value of reverse integration is carried to the control circuit 23 through a comparator 31.

The control circuit 23 is put into operation upon receipt of the pulse width-modulated first input signal $V_x$ which has been sent forth from the comparator 25 and output signals denoting the results of comparison which have been delivered from the comparators 28, 31 and issues an instruction for the respective switches of the switch assemblies 21, 26, 29 to be selectively operated. Accordingly, the control circuit 23 generates an output signal having a pulse width corresponding to a cumulatively added sum of the multiplication products of the first and second input signals $V_x$, $V_y$.

There will now be described by reference to FIG. 5 the concrete arrangement of the control circuit 23, and by reference to FIGS. 6A(a) to 6B(r) the operation of the respective sections thereof. As seen from FIG. 5, the control circuit 23 comprises a high speed clock pulse generator 50 consisting of, for example, a quartz oscillator. A pulse signal sent forth from the high speed clock pulse generator 50 is supplied to a 1/128 frequency divider 51 for frequency division. The frequency divider 51 produces sampling signals $t_0$ to $t_n$ having a prescribed period as shown in FIG. 6A(a). An output signal from the high speed clock pulse generator 50 is conducted to the CK terminal of a Delayed type flip-flop circuit (hereinafter referred to as "D-FF") 32. The D terminal of the D-FF 32 is supplied with an output signal from a comparator 33 which judges the polarity of the first input signal $V_x$. The logic level of an output signal from the D-FF 32 is changed from "1" to "0" or vice versa, each time the polarity of the first input signal $V_x$ is reversed. A Q or $\overline{Q}$ output signal, namely, A or $\overline{A}$ output signal from the D-FF 32 defines the length of a unit operation period $T_1$ or $T_2$. Where a first input signal $V_x$ is a voltage signal whose polarity is reversed for each length of time corresponding to half of the frequency of said voltage signal, then the A or $\overline{A}$ output may be taken to define the above-mentioned half period in which the polarity of the first input voltage signal $V_x$ is reversed as a unit operation period. For convenience of the following description, however, the sampling periods corresponding to the respective intervals at which the consecutive sampling signals $t_0$, $t_1$, $t_2$ indicated in FIG. 6A(a) are issued is taken as a unit operation period $T_1$ (FIG. 6A(c)). Similarly, three sampling periods corresponding to the respective intervals at which the consecutive sampling signals $t_3$, $t_4$, $t_5$ are sent forth is taken as a unit operation period $T_2$ (FIG. 6A(c)).

When the first switch $S_{1a}$ of the first switch assembly 21 is thrown in upon receipt of an instruction from the control circuit, then the PMW 22 is supplied with the first input signal as illustrated in FIG. 4. The control circuit 23 comprises a first counter 52 (FIG. 5) for counting clock pulses issued from the high speed clock pulse generator 50. The operation of the first switch $S_{1a}$ of the first switch assembly 21 is controlled in accordance with an output signal from a first flip-flop circuit 53 connected to the first counter 52 which is also controlled by an output count signal from said first counter 52. The first counter 52 has a capacity to make a maximum count of at least "128", and is reset at a prescribed initial value by an output from the frequency divider 51. Where the first counter 52 counts zero, the flip-flop circuit 53 is set to close the first switch $S_{1a}$, which in turn causes the first input signal $V_x$ to be supplied to the PWM 22 (FIG. 4) until the first counter 52 counts "48" (FIG. 6A(e)). In the meantime, the first input signal $V_x$ is integrated by the first integrator 24 (FIG. 6A(d)). When the first counter 52 has counted "48", the flip-flop circuit 53 is reset, thereby the first switch $S_{1a}$ is opened to suspend integration. At this time, a second flip-flop circuit 54 is set. A set output therefrom closes the second switch $S_{1b}$ of the first switch assembly 21, which in turn causes the first reference signal $+V_{E1}$ to be supplied to the integrator 24 (FIG. 6A(f)). The first reference signal $+V_{E1}$ has the same polarity as the first input signal $V_x$ and is also integrated as an addition to the integration of the first input signal $V_x$ (FIG. 6A(D)). This additional integration is continued, until counting by the first counter 52 is advanced from "48" to "52", and the second flip-flop circuit 54 is reset. At this time, the third flip-flop circuit 55 is set. A set output therefrom closes the third switch $S_{1c}$ of the first switch assembly 21, which in turn causes the second reference signal $-V_{E1}$ to be supplied to the first integrator 24, which now carries out the reverse integration of the integrated value of the first input signal $V_x$ and the additionally integrated value of the first reference signal $+V_{E1}$. Said reverse integration is continued, until the comparator 25 produce no output. Where counting by the first counter 52 is advanced from "52" to "56" during the above-mentioned reverse integration, then an output signal from the first counter 52 which denotes said advanced counting "56" sets the fourth flip-flop circuit 56, whose set output is conducted through an AND circuit 57 as an instruction to close the first switch $s_{2a}$ of the second switch assembly 26. The second input signal $V_y$ which is supplied when said first switch $S_{2a}$ is closed is integrated by the first integrator 27. A length of time required for reverse integration by the integrator 24 included in the PWM 22 is determined when an edge detection circuit 58 of the control circuit 23 detects that the comparator 25 produces no output. A detection output fom the edge detector 58 resets the third flip-flop circuit 55 to prevent the supply of the second reference signal $-V_{E1}$ for reverse integration (FIG. 6A(g)). The fourth flip-flop circuit 56 is also reset by a detection output from the edge detection circuit 58, thereby preventing an instruction for the supply of the second input signal $V_y$ from being further issued from the AND circuit 57 and rendering the first switch $S_{2a}$ of the second switch assembly 26 inoperative (FIG. 6A(h)). While the first reference signal $+V_{E1}$ is supplied, namely during the period in which the third flip-flop circuit 55 is kept from a set to a reset condition, counting by the first counter 52 is advanced from "48" to "52". A period extending from a point of time at which the reverse integration is commenced to a point of time at which the second input signal $V_y$ is supplied, namely, a period in which counts made by the first counter 52 is advanced from "52" to "56" is equal to a period in which the first reference signal $+V_{E1}$ continues to be supplied.

Accordingly, the period in which counting by the first counter 52 is further advanced from "56" and the fourth flip-flop circuit 56 is changed from a set to a reset condition denotes the integrated value of the first input signal $V_x$ at each sampling point which is obtained by substracting a length of time required for the reverse integration of the previously described additionally integrated value of the first reference signal $V_{E1}$, namely, a length of time required for the originally desired reverse integration. Therefore, the respective pulse widths shown in FIG. 6A(h) may be regarded to represent the pulse width-modulated first input signal $V_x$ delivered from the PWM 22. An output signal from the fourth flip-flop circuit 56 passes through the AND circuit 57 during the preceding operation period $T_1$ (FIG. 6A(c)) to actuate the first switch $S_{2a}$ of the second switch assembly 26, and is conducted through the AND circuit 59 during the succeeding half operation period $T_2$ to render the first switch $S_{3a}$ of the third switch assembly 29 conducting. During the preceding half operation period $T_1$, the first switch $S_{2a}$ of the second switch assembly 26 is thrown in to cause the second input signal $V_y$ to be supplied for integration for a length of time corresponding to the modulated pulse width of the first input signal $V_x$ (FIG. 6A(i)). An integrated value of the first and second input signals progressively increases from one sampling period to another. An integrated value obtained at each sampling point is the result of multiplying the first input signal $V_x$ by the second input signal $V_y$. A total value of integration at a sampling point $t_3$ represents a sum of the products of said multiplication carried out at the respective sampling points $t_0$, $t_1$, $t_2$.

When the preceding operation period $T_1$ is advanced to the succeeding operation period $T_2$ with the polarity of an operation period-defining signal reversed, then the edge detection circuit 60 detects the time of said reversion upon receipt of the resultant $\bar{Q}$ output from the D-FF 32. A detection output from the edge detection circuit 60 is conducted through an OR circuit 61 to reset a second counter 62 namely, to clear a count made thereby. This second counter 62 counts clock pulses issued from the high speed clock pulse generator 50, with progressive advances of counts. Where the second counter 62 counts zero, the fifth flip-flop circuit 63 is set. A set output therefrom is conducted through an AND circuit 64 as an instruction to close the second switch $S_{2b}$ of the second switch assembly 26, which in turn causes a third reference signal $+V_{E2}$ to the supplied. This third reference signal $+V_{E2}$ at the succeeding unit operation period $T_2$ is additionally integrated (FIG. 6A(i)) immediately after the integration of the first input signal $V_x$. This additional integration is continued, until the second counter 62 counts "50", a count output therefrom resets the fifth flip-flop circuit 63 to prevent the supply of an input signal to the gate of the AND circuit 64 and the second switch $S_{2b}$ of the second switch assembly 26 is opened (FIG. 6B(j)). When the fifth flip-flop circuit 63 is reset, then the sixth flip-flop circuit 65 is set upon receipt of a count output of "50" from the second counter 62. A set output from the sixth flip-flop circuit 65 is sent forth through an AND circuit 66 is an instruction to close the third switch $S_{2c}$ of the second switch assembly 26. When this third switch $S_{2c}$ is closed, then the fourth reference signal $-V_{E2}$ is supplied. A sum of the multiplication products of the first and second input signals $V_x$, $V_y$ cumulatively added during the unit operation period $T_1$ and a value obtained by the additional integration of the third reference signal $+V_{E2}$ are reversely integrated with the fourth reference signal $-V_{E2}$. Where the second counter 62 counts "100" during said reverse integration, a count output therefrom sets a seventh flip-flop circuit 67, which generates a set output (FIG. 6B(l)). The reverse integration based on the fourth reference signal $-V_{E2}$ is continued, until the comparator 28 does not detect any output from the second integrator 27. The point of time at which the comparator 28 ceases to produce any output is detected by an edge detection circuit 68 included in the control circuit 23 of FIG. 3. An edge detection output from said edge detection circuit 68 is supplied to the reset terminal of the sixth flip-flop circuit 65 through an AND circuit 69 and OR circuit 70 to prevent the supply of an input signal to the gate of the AND circuit 66. Therefore, the third switch $S_{2c}$ of the second switch assembly 26 is rendered inoperative which is used to supply the fourth reference signal $-V_{E2}$ for the above-mentioned reverse integration (FIG. 6B(k)). At this time, an output signal from the edge detection circuit 68 resets the sixth flip-flop circuit 67 to prevent it from generating an output (FIG. 6B(l)). A period in which the fifth flip-flop circuit 63 is changed from a set to a reset condition, namely, a period in which the third reference signal $+V_{E2}$ continues to be supplied is equal to a period extending from a point of time at which the sixth flip-flop circuit 65 is set to commence reverse integration to a point of time at which the seventh flip-flop circuit 67 is set during said reverse integration. This means that a pulse width (FIG. 6B(l)) representing a period in which the seventh flip-flop circuit 67 is changed from a set to a reset condition corresponds to that balance of the total time (FIG. 6(k)) required for the previously described overall reverse integration of the multiplication products of the first and second input signals cumulatively added during the unit operation period $T_1$ and an additionally integrated value of the third reference signal $+V_{E2}$, which is arrived at by subtracting a length of time required for the reverse integration of the additionally integrated value of the third reference signal $+V_{E2}$ from that required for said overall reverse integration. The foregoing description is given, because the absolute value of the third reference signal $+V_{E2}$ is equal to that of the fourth reference signal $-V_{E2}$ as expressed by the formula of $+V_{E2}=-V_{E2}$. Namely, the pulse width of a set output from the seventh flip-flop circuit 67 denotes a real length of time only required for the reverse integration of the multiplication products of the first and second input signals $V_x$, $V_y$ cumulatively added during the aforesaid unit operation period $T_1$.

Where the preceding unit operation period $T_1$ in which the multiplication products of the first and second input signals $V_x$, $V_y$ are cumulatively added by the first integrator 27 is advanced to the succeeding unit operation period $T_2$ in which the polarity of the operation period-defining signal is reversed, then a set outut from the fourth flip-flop circuit 56 is sent forth through the AND circuit 59 as an instruction to close the first switch $S_{3a}$ of the third switch assembly 29. Accordingly, the integrator 30 integrates the second input signal $V_y$(FIG. 6B(h)) for a length of time corresponding to the respective pulse widths of the first input signal $V_x$ and cumulatively adds (FIG. 6B(m)) the values of said integration during the succeeding unit operation period $T_2$.

Where this unit operation period $T_2$ is further advanced to the following operation period in which the polarity of the operation-defining signal is again reversed, and a Q output is issued from the flip-flop circuit 32, then said Q output is detected by an edge detection circuit 71. A detection output therefrom is conducted through the OR circuit 61 to reset the second counter 62. When this second counter 62 is reset to have its count cleared, the fifth flip-flop circuit 63 is again set. A set output therefrom is delivered through an AND circuit 72 as an instruction to close the second switch $S_{3b}$ of the third switch assembly 29. As the result, the third reference signal $+V_{E2}$ is integrated by the integrator 30 as an addition to the integrated values of the first and second input signals $V_x$, $V_y$ cumulatively added during the unit operation period $T_2$. The above-mentioned integration of the third reference signal $+V_{E2}$ is continued (FIG. 6B(o)), until the second counter 62 counts "50", and the fifth flip-flop circuit 63 is reset. When the fifth flip-flop circuit 63 is reset, the sixth flip-flop circuit 65 is conversely set. A set output from said sixth flip-flop circuit 65 is sent forth through an AND circuit 73 as an instruction to close the third switch $S_{3c}$ of the third switch assembly 29. Accordingly, the reverse integration of the aforesaid additionally integrated value of the third reference signal $+V_{E2}$ is continued, until the comparator 31 ceases to produce any output, namely, until an edge detection circuit 74 included in the control circuit 23 detects a point of time at which no output is generated from the comparator 31, and a detection output from said edge detection circuit 74 resets the sixth flip-flop circuit 65 through an AND circuit 75 and OR circuit 70 (FIG. 6B(p)). When the second counter 62 counts "100" during the above-mentioned reverse integration, the seventh flip-flop circuit 67 is set, and issues a set output, until it is reset at the same time as when the sixth flip-flop circuit 65 is reset (FIG. 6B(q)). During the respective unit operation periods in which the polarity of an operation period-defining signal is reversed in succession, the control circuit 23 issues a clock pulse (FIG. 6B(r)) whose width corresponds to a cumulatively added sum of multiplication products of the first and second input signals $V_x$, $V_y$. The counter 15 (FIG. 1) counts clock pulses sent forth from the clock pulse generator 5 through the AND circuit 14 for a length of time corresponding to the abovementioned pulse width of a signal representing the cumulatively added integrated values of the first and second input signals $V_x$, $V_y$. A count thus made is indicated on the display device 17 through the decode-driver 16. In this case, the clock pulse generator 5 of FIG. 1 may be of the same type as the high speed clock pulse generator 50 of FIG. 5. With the foregoing embodiment, it is required that the absolute voltage level $+V_{E1}$ of the first reference signal $+V_{E1}$ which is integrated in addition to the integrated value of the first input signal $V_x$ be equal to the absolute voltage level $-V_{E1}$ of the second reference signal $-V_{E1}$ used in the reverse integration. Where this invention is practised under the condition of, for example, $+V_{E1}=2\ -V_{E1}$, then it is necessary to subtract twice the period in which the first reference signal $+V_{E1}$ is inversely integrated. Then it is possible to obtain the desired object of the invention.

With the foregoing embodiment, two integrators were provided. Each of these integrators alternately carried out the cumulative addition of the integrated values of the products of the first and second input signals for each unit operation period. However, it is possible selectively to use a plurality of integrators. In this case, integration during a given unit operation period is undertaken by one integrator, and reverse integration is carried out through out the succeeding two consecutive unit operation periods with a second integrator used during the former one of said two consecutive periods and a third integrator applied during the latter one thereof. This arrangement enables measurement to be made with higher precision than possible in the past.

Figure 5:
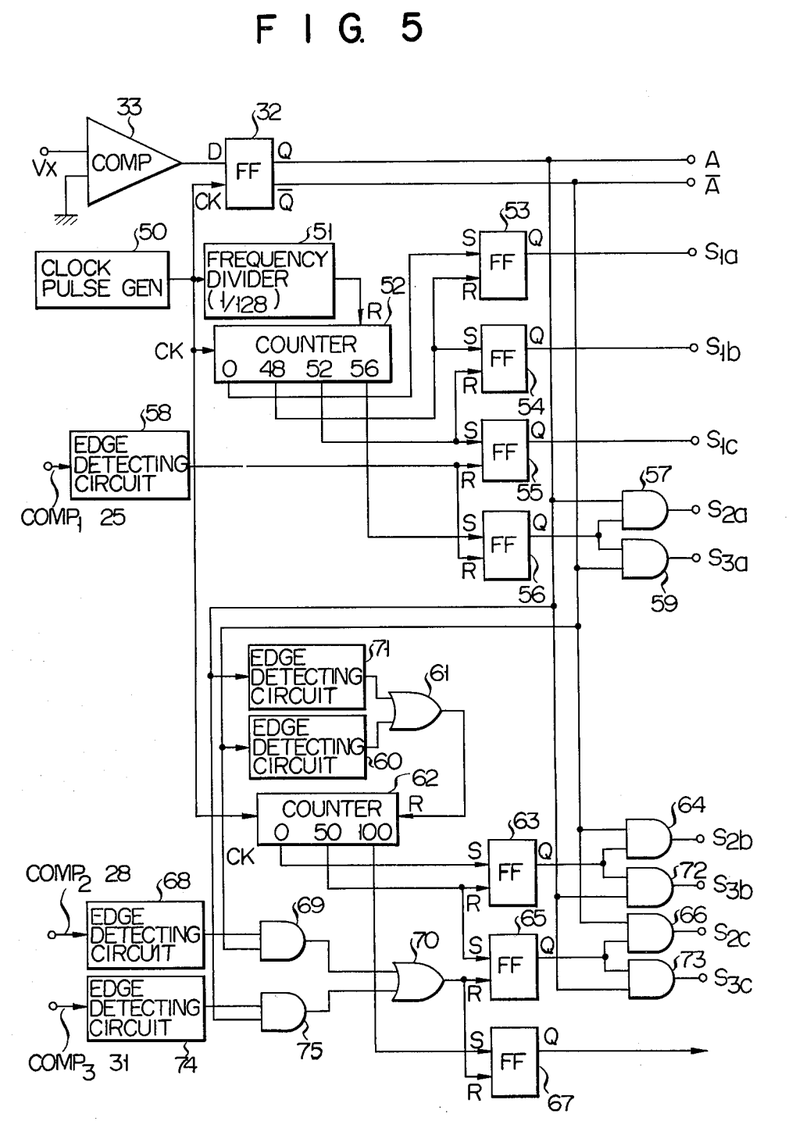
FIG. 5 indicates the concrete arrangement of a control circuit used with the second embodiment of FIG. 4.
Figure 6A:
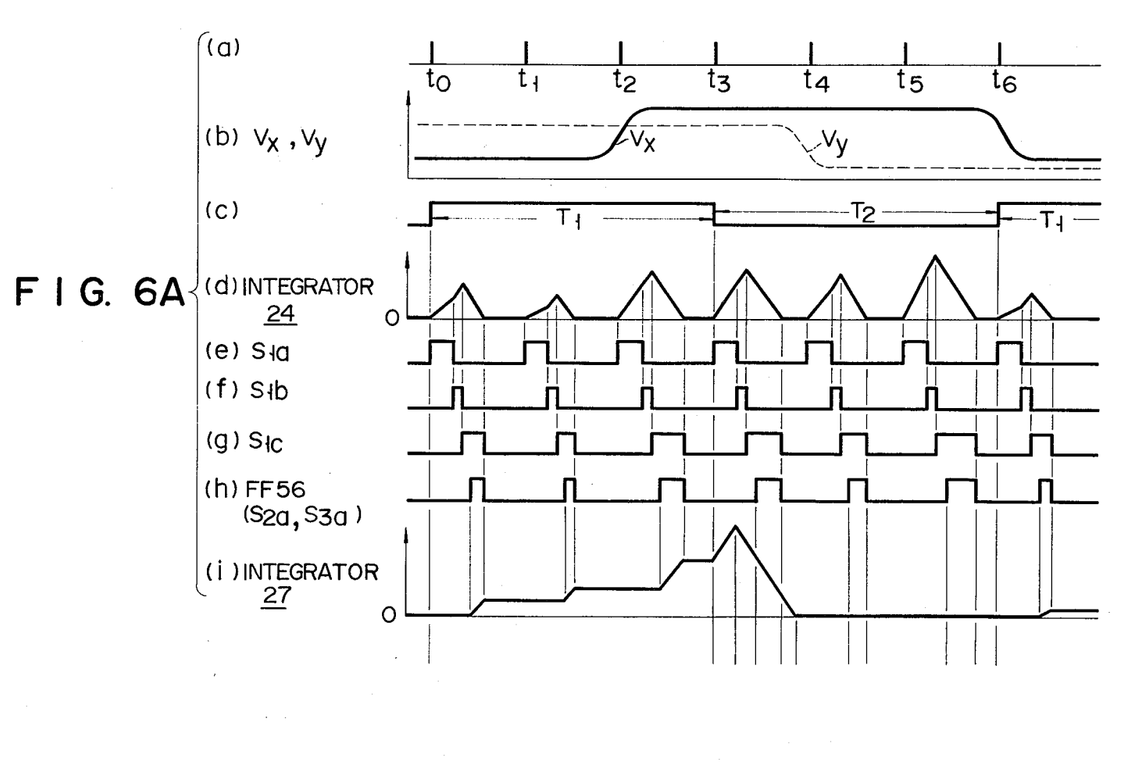
Figure 6B:
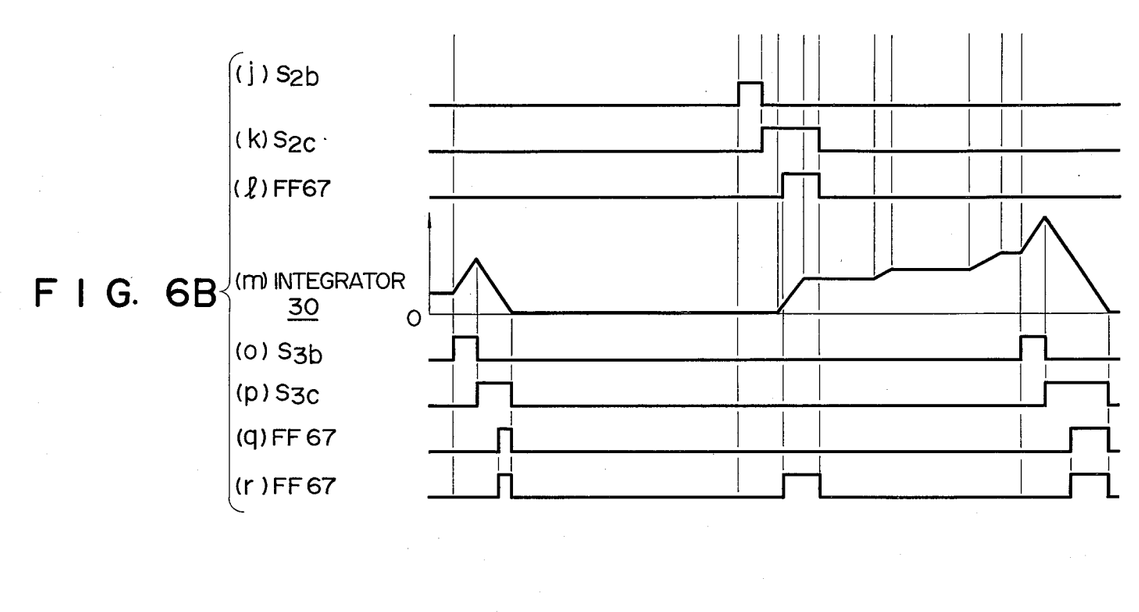

With the embodiment jointly represented by FIGS. 4 and 5, an integrated value of the first input signal $V_x$ or integrated values of the product of the first and the second input signals $V_x$, $V_y$ cumulatively added during a unit operation period are not immediately subjected to reverse integration. Instead, a reference signal having the same polarity as the first input signal $V_x$ is additionally integrated immediately after the cumulative addition of the integrated values of the first input signal $V_x$. All the integrated values are subjected to reverse integration with another reference signal having the opposite polarity to the aforesiad additionally integrated reference signal. A length of time required for the reverse integration of the additionally integrated value of the first mentioned reference signal is subtracted from a total length of time required for the above-mentioned overall reverse integration. This arrangement makes it possible accurately to determine the pulse width of the first input signal $V_x$ or a cumulatively added sum of the multiplication products of the first and second input signals $V_x$, $V_y$, even where the polarity of the first and second input signals $V_x$, $V_y$ is misjudged.

There will now be described by reference to FIGS. 7(a) to 7(d) and FIGS. 8(a) to 8(h) the reason why the above-mentioned advantageous effect of this invention is ensured.

Figure 7:
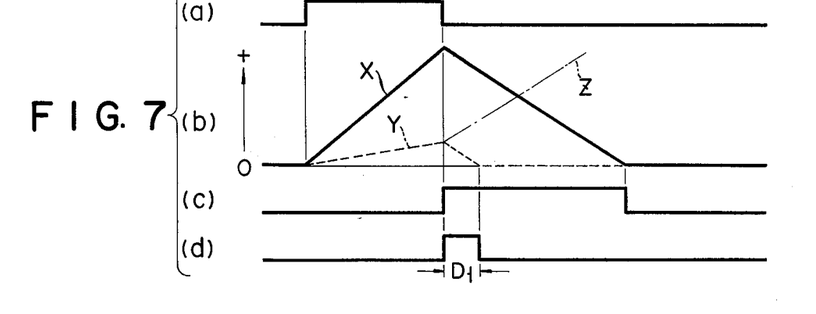

A comparator for judging the voltage level of an output signal from an integrator generally tends to exhibit an erroneous behavior, if the output signal has an extremely low voltage level. There will now be discussed the case where an input signal having a pulse width shown in FIG. 7(a) is integrated to provide an integration level X, and this integration level X is subjected to reverse integration with a reference signal having the opposite polarity to the input signal. If, in this case, the integration level X of the input signal is sufficiently high, it is easy to judge the polarity of said integration level X, thus, enabling reverse integration to be carried out under normal condition. Where, however, the input signal has a very low integration level Y as indicated in broken lines in FIG. 7(b), then the polarity of such low integration level Y tends to be misjudged due to the limited capacity of the comparator. Now let it be assumed that the integration level Y is originally chosen to have a positive polarity. The integration level Y is subjected to reverse integration and with the input signal mistaken to have a negative polarity, resulting in the failure to count a period $D_1$ of said reverse integration shown in FIG. 7(d). In such case, a reference signal having a positive polarity is erroneously used as a base in reverse integration. Then, an integration level Z indicated in a dot-dash line in FIG. 7(b) results, thereby failing to provide a desired value of reverse integration.

Figure 8:
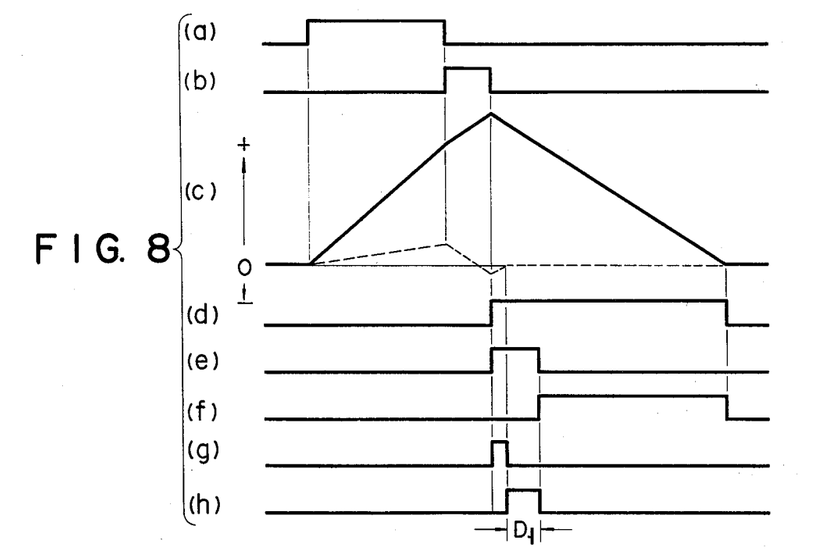

According to this invention, therefore, an input signal having a pulse width shown in FIG. 8(a) is first integrated, and thereafter a reference signal having the same polarity as the input signal is additionally integrated for a prescribed period (FIG. 8(b)). A value of the overall integration is obtained as illustrated in FIG. 8(c). This value of the overall integration is subjected to reverse integration with another reference signal having the opposite polarity to the additionally integrated reference signal. That portion (FIG. 8(e)) of the period of the overall reverse integration which corresponds to said additionally integrated reference signal is subtracted. The resultant balance (FIG. 8(f)) is counted as a length of time actually required for the reverse integration of the integrated value of the input signal. Where the above-mentioned process of this invention is followed, let it be assumed that the polarity of an input signal is misjudged due to its very low integration level, consequently an integrated value of a reference signal having the opposite polarity to the input signal is reversely integrated during a period (FIG. 8(b)) as indicated in a broken line in FIG. 8(c) instead of being additionally integrated. Eventually, therefore, integration is carried out, as indicated in a broken line in FIG. 8(c), by applying a reference signal having the same polarity as the input signal, though reverse integration should normally be conducted with a reference signal having the opposite polarity to the input signal taken as a base. Therefore, a length of time required for the originally undertaken overall reverse integration of a cumulatively added sum of the integrated values of the input signal and the additionally integrated value of a reference signal is indicated in the form of a pulse width shown in FIG. 8(g). When a length of time (FIG. 8(e)) required for the reverse integration of the additionally integrated value of a reference signal is subtracted from a length of time corresponding to the above-mentioned pulse width of FIG. 8(g), then a negative length of time is obtained as a balance. An absolute value of said negative balance is expressed as $D_1$ as indicated in FIG. 8(h). This means that even where the integration level X of an input signal is misjudged, the present invention can determine a length of time required for the overall reverse integration of a cumulatively added sum of the integrated values of the first and second input signals and the additionally integrated value of a reference signal as correctly as in the case where the polarity of an input signal is not misjudged. As previously mentioned, according to the embodiment of this invention, a plurality of sampling periods are taken as a unit operation period. The multiplication products of the first and second input signals obtained during the respective sampling periods are cumulatively added through out said unit operation period. During the succeeding unit operation period in which the polarity of an operation period-defining signal is reversed, a cumulatively added sum of the integrated values of the product of the first and second input signals are reversely integrated. Said cumulatively added sum is counted from a length of time required for said reverse integration, thereby enabling measurement to be carried out with high precision. Further, integration and reverse integration are alternately performed by each of a plurality of integrators from one unit operation period to another. Therefore, integration of input signals is uninterruptedly carried out throughout a prescribed series of unit operation periods, thereby successively providing the integrated values of input signals. Moreover, as previously described, integrated values of input signals can always be accurately measured, should a comparator make an erroneous behavior due to the misjudgment of the polarity of an input signal resulting from its low integration level. Consequently, the arithmetic operation apparatus for an electronic watt-hour meter of this invention is prominently effective for the processing of data by various types of process controllers.

This invention is not limited to the foregoing embodiment. The two comparators supplied with output signals from the first and second integrators respectively may be replaced by a single comparator which is designed to be operated by means of time division. Where half the prescribed period of a voltage signal is taken as a unit operation period in which the polarity of an operation period- defining signal is reversed each time, then it is unnecessary rigidly to control the reversion of the polarity of a reference signal supplied to the integrator, thus offering convenience in simplifying the arrangement of an arithmetic operation apparatus, and also prominently facilitating the control of the switching circuit. Namely, in the case of an integrating wattmeter, the first input signal $V_x$ is a sine wave voltage signal having a frequency of, for example, 50 Hz. The second input signal $V_y$ is generally a sine wave voltage signal having a different phase from the first input signal $V_y$. Where, in this case, the repetitive frequency of the first and second unit operation periods is taken to be 50 Hz (1/20 msec.), an amount of integrated watt-hour during the half period (10 msec.) has a positive value. At this time, a pulse width modulated signal is obtained from the first input signal $V_x$. The second input signal is integrated by said PWM signal in the integrators 8, 9. Where said integration value is reversely integrated with the reference voltage signal $\pm V_f$, the counter always has only to make upcounting, because the multiplication products of the first and second input signals cumulatively added during the half period has a positive value.

Where half the prescribed period of a voltage signal is taken as a unit operation period, it is possible to ensure system synchronization by means of, for example, a phase locked loop (PLL) circuit. Further, the polarity and level of a reference signal can be suitably defined in accordance with the characteristic of first and second input signals $V_x$, $V_y$ and also the specification of devices associated with the arithmetic operation apparatus.

It is to be understood that the above-described arrangements are illustrative of the applications of the principles of this invention. Numerous other arrangements may be devised by those skilled in the art without departing from the scope of the invention.

What is claimed is:

1. An arithmetic operation apparatus for an electronic watt-hour meter which comprises:

clock means for generating clock pulses having a reference frequency;

first frequency divider means coupled to said clock means for dividing the frequency of said clock pulses and for producing a sampling signal which defines a sampling period;

pulse width modulator means for receiving a first input signal and said sampling signal and for producing an output signal composed of a series of pulses occurring at the frequency of said sampling signal wherein each pulse has a width proportional to the amplitude of said first input signal;

switching means for receiving a second input signal, said output signal from said pulse width modulator means, and a reference voltage signal, for producing a combination signal composed of a series of pulses occurring at the frequency of said sampling signal wherein each pulse has an amplitude proportional to the amplitude of said second input signal and a pulse width proportional to the amplitude of said first input signal, for supplying said combination signal to a first output terminal and said reference voltage signal to a second output terminal during a first unit operation period which consists of a plurality of sampling periods, and for supplying said combination signal to said second output terminal and said reference voltage signal to said first output terminal during a second unit operation period which consists of a plurality of sampling periods, said first and said second unit operation periods recurring alternately;

first integrator means coupled to said first output terminal of said switching means for receiving and integrating said combination signal during said first unit operation period and for receiving and integrating said reference voltage signal during said second unit operation period, said reference voltage signal having a polarity opposite to that of the integrated output of said first integrator means appearing during said first unit operation period, said first integrator means acting as a reverse integrator during said second unit operation period by integrating said reference voltage signal until the output of said first integrator means is reduced to zero;

second integrator means coupled to said second output terminal of said switching means for receiving and integrating said combination signal during said second unit operation period and for receiving and integrating said reference voltage signal during said first unit operation period, said second integrator means acting as a reverse integrator during said first unit operation period by integrating said reference voltage signal until the output of said second integrator means is reduced to zero;

counter means coupled to said clock generator means and to said first and said second integrator means for counting said clock pulses which occur during the portion of said first unit operation period in which said second integrator means is reducing its output to zero by integrating said reference voltage signal and during the portion of said second unit operation period in which said first integrator means is reducing its output to zero by integrating said reference voltage signal, the output of said counter means corresponding to the multiplication product of said first and said second input signals; and display means for displaying the output of said counter means.

2. An arithmetic operation apparatus for an electronic watt-hour meter as recited in claim 1 which further comprises:

second frequency divider means coupled to said clock means for dividing the frequency of said clock pulses and for producing an output having a frequency which defines the period of said first and said second unit operation periods, the period of the output of said second frequency divider means being equal to a plurality of sampling periods; and control means coupled to the output of said second frequency divider means for producing control signals for said switching means and for said first and said second integrator means.

3. An arithmetic operation apparatus for an electronic watt-hour meter which comprises:

clock means for generating clock pulses having a reference frequency;

frequency divider means coupled to said clock means for dividing the frequency of said clock pulses and for producing a sampling signal which defines a sampling period;

pulse width modulator means for receiving a first input signal and said sampling signal and for producing an output signal composed of a series of pulses occurring at the frequency of said sampling signal wherein each pulse has a width proportional to the amplitude of said first input signal;

switching means for receiving a second input signal, said output signal from said pulse width modulator means, a first reference voltage signal, and a second reference voltage signal, for producing a combination signal composed of a series of pulses occurring at the frequency of said sampling signal wherein each pulse has an amplitude proportional to the amplitude of said second input signal and a pulse width proportional to the amplitude of said first input signal, for supplying to a first output terminal said combination signal during a first unit operation period which consists of at least one sampling period, said first reference voltage signal for a fixed period of time at the beginning of a second unit operation period which consists of at least one sampling period, and said second reference voltage signal for a variable time during the remainder of said second unit operation period, and for supplying to a second output terminal said combination signal during said second unit operation period, said first reference voltage signal for a fixed period of time at the beginning of said first unit operation period, and said second reference voltage signal for a variable time during the remainder of said first unit operation period, said first and said second unit operation periods recurring alternately, said first reference voltage signal being opposite in polarity to said second reference voltage signal;

first integrator means coupled to said first output terminal of said switching means for receiving and integrating said combination signal during said first unit operation period, for receiving and integrating said first reference voltage signal at the beginning of said second unit operation period, and for receiving and integrating said second reference voltage signal during the remainder of said second unit operation period, said first reference voltage signal having the same polarity as that of the integrated output of said first integrator means during said first unit operation period, said second reference voltage signal being removed from said first output terminal of said switching means during said second unit operation period when the output of said first integrating means has been reduced to zero;

second integrator means coupled to said second output terminal of said switching means for receiving and integrating said combination signal during said second unit operation period, for receiving and integrating said first reference voltage signal at the beginning of said first unit operation period, and for receiving and integrating said second reference voltage signal during the remainder of said first unit operation period, said second reference voltage signal being removed from said second output terminal of said switching means during said second unit operation period when the output of said second integrator means has been reduced to zero; and means coupled to said first and said second integrator means and to said switching means for subtracting during each unit operation period the fixed length of time in which said first reference voltage signal is applied to each of said first and said second integrator means from the length of time said second reference voltage signal is applied to each of said integrator means, and for producing an output pulse during each unit operating period, said pulse having a pulse width proportional to the product of said first and said second input signals.

4. An arithmetic operation apparatus for an electronic watt-hour meter as recited in claim 3 wherein said pulse width modulator means comprises:

selector means for receiving said sampling signal, said first input signal, a third reference voltage signal, and a fourth reference voltage signal, and for supplying to an output terminal of said selector means said first input signal for a fixed length of time following each pulse of said sampling signal followed by said third reference voltage signal for a fixed length of time followed by said fourth reference voltage signal for a variable length of time, said third reference voltage signal and said fourth reference voltage signal being of opposite polarity;

third integrator means coupled to the output terminal of said selector means for integrating the output of said selector means, said third reference voltage signal being of the same polarity as the output of said third integrator means during the integration of said first input signal, said fourth reference voltage signal being removed from the output terminal of said selector means when the output of said third integrator means has been reduced to zero;

means coupled to said selector means and to said third integrator means for subtracting during each sampling period the fixed length of time in which said third reference voltage signal is applied to said third integrator means from the length of time said fourth reference voltage signal is applied to said third integrator means, and for producing an output pulse during each sampling period, said pulse having a pulse width proportional to the amplitude of said first input signal.

5. An arithmetic operation apparatus for an electronic watt-hour meter as recited in claim 3, which further comprises:

comparator means coupled to receive said first input signal for generating an output signal, said output signal being indicative of the polarity of said first input signal;

logic means coupled to receive the output of said comparator means and said clock pulses for generating an output signal which defines said first and said second unit operation periods, said output signal from said logic means changing from one logic level to another upon the coincidence of a clock pulse and a change in the polarity of said first input signal occurring subsequent to the immediately previous clock pulse; and control means coupled to the output of said logic means for producing control signals for said switching means and for said first and said second integrator means.

* * * * *